United States Patent
Wang

(10) Patent No.: US 11,456,216 B2
(45) Date of Patent: Sep. 27, 2022

(54) FABRICATION METHOD OF SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 17/224,395

(22) Filed: Apr. 7, 2021

(65) Prior Publication Data
US 2021/0335671 A1    Oct. 28, 2021

(30) Foreign Application Priority Data
Apr. 23, 2020   (CN) .......................... 202010328310.1

(51) Int. Cl.
*H01L 21/8234*   (2006.01)
*H01L 29/66*   (2006.01)

(52) U.S. Cl.
CPC ............ *H01L 21/823431* (2013.01); *H01L 21/823412* (2013.01); *H01L 21/823481* (2013.01); *H01L 29/6681* (2013.01)

(58) Field of Classification Search
CPC ......... H01L 21/8232; H01L 21/823431; H01L 21/823468; H01L 21/823481; H01L 21/823807; H01L 21/823821; H01L 21/823864; H01L 21/823878; H01L 29/42392; H01L 29/66545; H01L 29/6656; H01L 29/66795; H01L 29/6681; H01L 29/785; H01L 29/7851; H01L 29/78696; H01L 29/0673; B82Y 10/00; B82Y 40/00
See application file for complete search history.

(56) References Cited

U.S. PATENT DOCUMENTS

2021/0126099 A1* 4/2021 Young ................ H01L 29/0653

* cited by examiner

*Primary Examiner* — Cheung Lee
(74) *Attorney, Agent, or Firm* — Anova Law Group, PLLC

(57) ABSTRACT

A fabrication method of a semiconductor structure is provided. The method includes: providing a substrate; forming fin structures on the substrate along a first direction with isolation grooves between adjacent fin structures, where each fin structure includes sacrificial layers stacked along a normal direction of the substrate and a channel layer between every two adjacent sacrificial layers; forming a first isolation layer in each isolation groove; forming a second isolation layer at a surface of each first isolation layer to fill up a corresponding isolation groove; forming a dummy gate structure; removing first isolation layers; removing the dummy gate structure to form a gate opening at ends of the sacrificial layers along a second direction perpendicular to the first direction; removing the sacrificial layers to form gate grooves between adjacent channel layers; and forming a gate structure in the gate opening and the gate grooves surrounding the channel layers.

20 Claims, 13 Drawing Sheets

FABRICATION METHOD OF SEMICONDUCTOR STRUCTURE

CROSS-REFERENCES TO RELATED APPLICATION

This application claims the priority of Chinese Patent Application No. 202010328310.1, filed on Apr. 23, 2020, the content of which is incorporated herein by reference in its entirety.

TECHNICAL FIELD

The present disclosure generally relates to the field of semiconductor technology and, more particularly, relates to a fabrication method of a semiconductor structure.

BACKGROUND

A metal-oxide-semiconductor field effect transistor (MOSFET) is one of the most important devices in modern integrated circuits. A basic structure of the MOSFET includes a semiconductor substrate, gate structures on a surface of the semiconductor substrate, and source/drain doped layers in the semiconductor substrate at sides of each gate structure. Each gate structure includes a gate dielectric layer on the surface of the semiconductor substrate and a gate electrode layer on a surface of the gate dielectric layer.

As semiconductor technologies develop, the control capability of a conventional planar MOSFET on channel currents becomes weaker, inducing serious leakage currents. A fin field effect transistor (Fin FET) is an emerging multi-gate device. A FinFET generally includes fins protruding from the surface of the semiconductor substrate, gate structures covering a portion of top surfaces and sidewalls of the fins, and source/drain doped regions in the fins at two sides of each gate structure. Compared with planar MOSFETs, FinFETs have stronger short-channel suppression capability and stronger operating currents.

As semiconductor technologies develop further, traditional FinFETs have limitations in further increasing the operating currents. Specifically, since only an area close to the top surface and the sidewalls of the fins is used as the channel region, the volume of the fins used as the channel region is small, limiting the increase of the operating currents, in the FinFET. Therefore, a MOSFET with a gate-all-around (GAA) structure is proposed, to increase the volume used as the channel region and further increase the operating currents of the GAA-structure MOSFET.

However, the electrical performance of a GAA-structure MOSFET in existing technologies needs to be improved.

SUMMARY

One aspect of the present disclosure provides a fabrication method for forming a semiconductor structure. The method includes: providing a substrate; forming a plurality of fin structures on the substrate arranged parallelly along a first direction with isolation grooves between adjacent fin structures of the plurality of fin structures, where each of the plurality of fin structures includes a plurality of sacrificial layers stacked along a normal direction of a surface of the substrate and a channel layer between every two adjacent sacrificial layers of the plurality of sacrificial layers; forming a first isolation layer in each isolation groove; forming a second isolation layer at a surface of each first isolation layer to fill up a corresponding isolation groove; forming a dummy gate structure; removing first isolation layers; removing the dummy gate structure to form a gate opening at ends of the plurality of sacrificial layers along a second direction perpendicular to the first direction; removing the plurality of sacrificial layers to form gate grooves between adjacent channel layers; and forming a gate structure in the gate opening and the gate grooves, wherein the gate structure surrounds the channel layers.

Optionally, the first isolation layers are disposed at sidewalls of adjacent fin structures of the plurality of fin structures.

Optionally, the dummy gate structure is formed after forming the second isolation layers, and the dummy gate structure crosses adjacent fin structures of the plurality of fin structures along the second direction.

Optionally, the method further includes: forming a dielectric layer on the substrate, wherein the dielectric layer is disposed on sidewalls of the dummy gate structure and exposes a top surface of the dummy gate structure.

Optionally, the first isolation layers and the second isolation layers are formed by: forming a first isolation material layer on the surface of the substrate, top surfaces of the plurality of fin structures, and sidewalls of the plurality of fin structures; etching back the first isolation material layer, to expose the surface of the substrate and the top surfaces of the plurality of fin structures; forming a second isolation material layer on the substrate, the top surfaces of the plurality of fin structures, top surfaces of the first isolation layers, and sidewalls of the first isolation layers, to fill up the isolation grooves; planarizing the second isolation material layer until exposing the top surface of the substrate, the top surfaces of the plurality of fin structures, and the top surfaces of the first isolation layers, to form the first isolation layers and the second isolation layers; and after forming the first isolation layers and the second isolation layers, removing a portion of the first isolation material layer and the second isolation layer outside the isolation grooves.

Optionally, the first isolation material layer is formed by an atomic layer deposition process and the second isolation material layer is formed by an atomic layer deposition process.

Optionally, the first isolation layers are made of a material different from a material of the second isolation layers.

Optionally, the first isolation layers are made of $SiO_2$, SiNO, amorphous carbon, SiGe, or a combination thereof; and the second isolation layers are made of $SiN_x$, SiC, or a combination thereof.

Optionally, the first isolation layers are removed by a wet etch process or a dry etch process.

Optionally, a thickness of each first isolation layer is about 2 nm to about 6 nm; and a thickness of each second isolation layer is about 2 nm to about 6 nm.

Optionally, the plurality of fin structures is formed by: forming a fin material film including a plurality of sacrificial material films stacked along the normal direction of the surface of the substrate and a channel material film between each two adjacent sacrificial material films of the plurality of sacrificial material films, on the substrate; forming a patterned layer on the fin material film; and etching the fin material film by using the patterned layer as a mask until exposing the surface of the substrate, to form the plurality of fin structures, where each of the plurality of fin structures includes the plurality of sacrificial layers stacked along the normal direction of the surface of the substrate and one channel layer between each two adjacent sacrificial layers of the plurality of sacrificial layers.

Optionally, the method further includes: etching the plurality of fin structures by using the dummy gate structure as a mask, to form source/drain grooves in the plurality of fin structures; and etching the source/drain grooves to expose the plurality of sacrificial layers and form fin grooves between adjacent channel layers.

Optionally, the plurality of sacrificial layers and the channel layers are made of different materials.

Optionally, the plurality of sacrificial layers is made of single-crystalline GeSi; and the channel layers are made of single-crystalline silicon.

Optionally, the method further includes forming a barrier layer in each fin groove.

Optionally, the barrier layer is formed by: forming a first initial barrier layer on sidewalls and bottom surfaces of the source/drain grooves, and the sidewalls and top surface of the dummy gate electrode layer; etching back the first initial barrier layer until exposing the bottom surfaces of the source/drain grooves and the top surface of the dummy gate electrode layer, to form a second initial barrier layer; and etching back the second initial barrier layer until exposing the sidewalls of the channel layers, to form one barrier layer in each fin groove.

Optionally, the barrier layer is made of a material including $SiN_x$.

Optionally, the first initial barrier layer is formed by a physical vapor deposition process or a chemical vapor deposition process; and the first initial barrier layer and the second initial barrier layer are etched back by a wet etch process, a dry etch process, or a combination thereof.

Optionally, the method further includes: forming source/drain doped layers in the source/drain grooves, wherein the source/drain doped layers include source/drain ions, where the source/drain doped layers are formed by an epitaxial growth process, and the source/drain ions are doped into the source/drain doped layers by an in-situ doping process.

Optionally, the dummy gate structure includes a dummy gate electrode layer; and the dummy gate electrode layer is made of polycrystalline silicon, amorphous silicon, or a combination thereof.

Optionally, the gate structure includes a gate electrode layer; and the gate electrode layer is made of a metal including tungsten.

Optionally, the gate structure is formed by: forming an initial gate structure in the gate opening and the gate grooves, to cover the second isolation layers; and planarizing the initial gate structure until exposing the top surfaces of the second isolation layers, to form the gate structure.

In the present disclosure, a first isolation layer and a second isolation layer may be formed sequentially in each isolation groove, and then a dummy gate structure may be formed on the substrate. After forming the dummy gate structure, the first isolation layer may be removed to form gaps between the second isolation layer and each of adjacent fins. Correspondingly, when removing the sacrificial layer subsequently, the sacrificial layer may be removed from two sidewalls of the sacrificial layer simultaneously. The efficiency of the etch and removing may be improved, and complete removal of the sacrificial layer may be guaranteed. When forming a gate structure subsequently, the gate structure may be deposited from two sides of a gate groove simultaneously. The deposition efficiency of the gate structure, and dense of the formed gate structure may be improved. Further, the formed gate structure could surround a channel layer from four sides, and correspondingly an area of a channel region formed by the channel layer surrounded by the gate structure may be increased and the performance of the semiconductor structure may be improved effectively. Also, by forming the second isolation layer in the isolation groove, cutting the dummy gate structure subsequently may be avoided. An etching process using a photomask mask may be avoided and the difficulty of the fabrication process may be reduced.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

The electrical performance of a GAA-structure MOSFET needs to be improved.

Figure 1:
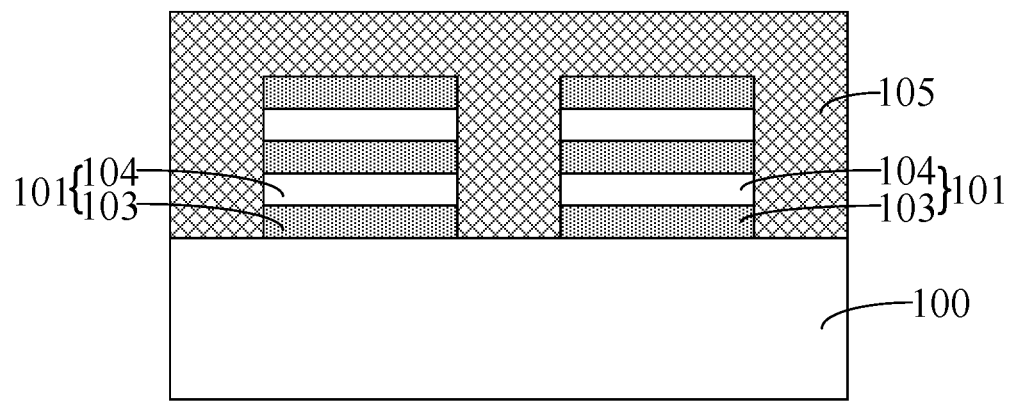
FIGS. 1-2 illustrate a semiconductor structure.
Figure 2:
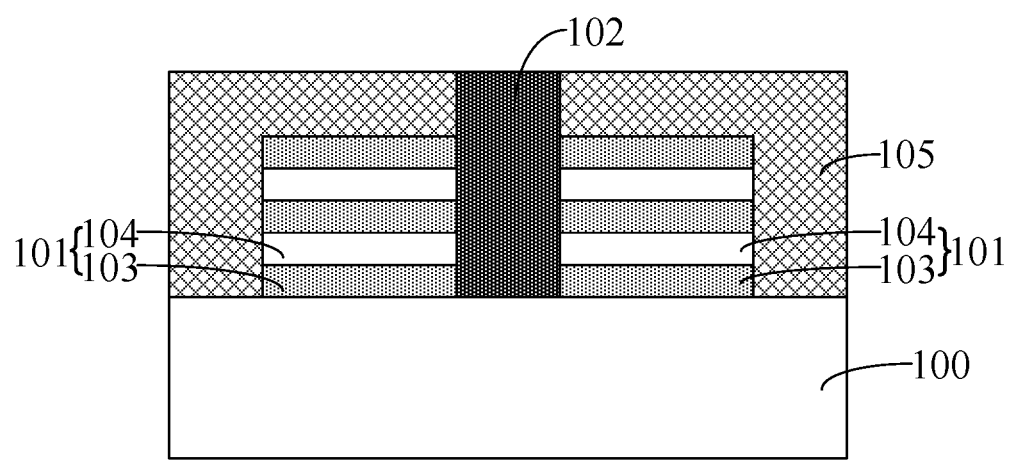

FIG. 1 and FIG. 2 illustrate a semiconductor structure. As illustrated in FIG. 1, a substrate 100 is provided. A plurality of fin structures 101 is formed on the substrate 100 and arranged parallelly along a first direction. An isolation groove (not illustrated) is disposed between two adjacent fin structures of the plurality of fin structures 101. Each of the plurality of fin structures 101 includes a plurality of sacrificial layers 103 overlapping along a normal direction of the surface of the substrate 100 and channel layers 104 between two adjacent sacrificial layers 103 of the plurality of sacrificial layers 103. A dummy gate structure 105 is formed on the substrate 100 to cross two adjacent fin structures 101 of the plurality of fin structures 101. The dummy gate structure 105 extends along a second direction perpendicular to the first direction.

As illustrated in FIG. 2, subsequently, a portion of the dummy gate structure 105 is removed to expose the isolation groove, and an isolation layer 102 is formed in the isolation groove.

The formed isolation layer 102 covers a sidewall of each sacrificial layer 103. In subsequent processes, the sacrificial layers 103 and the dummy gate structure 105 are removed by a wet etch process, to form a gate groove and a gate opening. Since the formed isolation layer 102 covers a sidewall of each sacrificial layer 103, when etching and removing the sacrificial layer 102, etch solution can only be applied to another sidewall of each sacrificial layer 103 to perform etch and removing. Etching efficiency is compromised and the sacrificial layer 103 cannot be removed completely. Subsequently, after forming the gate groove, a gate structure is formed in the gate groove, surrounding the channel layers 104. Since a side of the gate groove is covered by the isolation layer 102, when forming the gate structure, the deposition of the gate structure can only be performed from another side of the gate groove. The deposition efficiency is comprised, and the formed gate structure is not dense. Further, the formed gate structure can only cover the channel layers 104 from three sides. Correspondingly, an area of the channel region formed by the gate structure covering the channel layers 104 is decreased. The performance of the formed semiconductor structure is poor.

Figure 3:
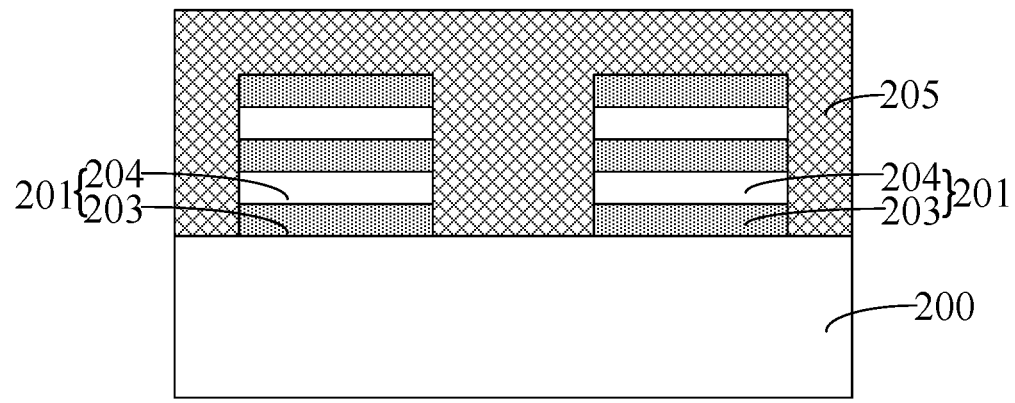
FIGS. 3-4 illustrate another semiconductor structure.
Figure 4:
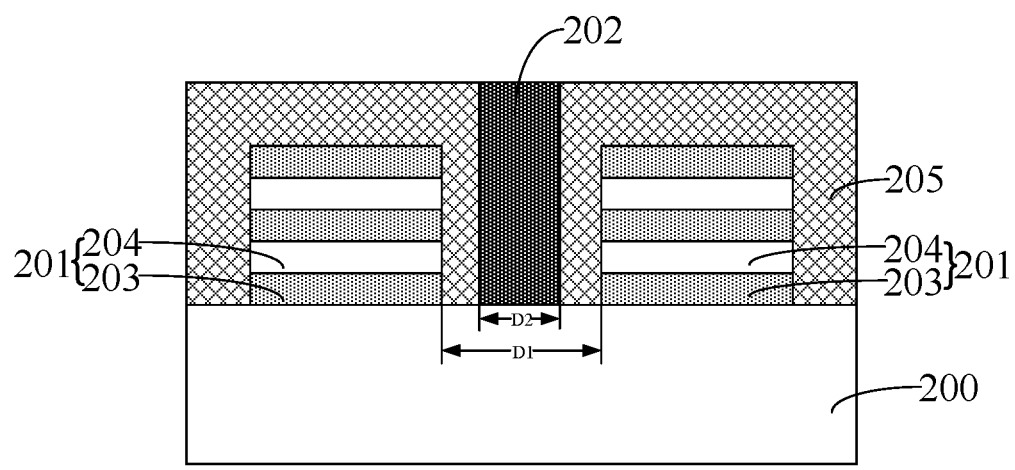

FIG. 3 and FIG. 4 illustrate another semiconductor structure. As illustrated in FIG. 3, a substrate 200 is provided. A plurality of fin structures 201 is formed on the substrate 200 and arranged parallelly along a first direction. An isolation groove (not illustrated) may be disposed between two adjacent fin structures of the plurality of fin structures 201. The isolation groove has a first width D1. Each of the plurality of fin structures 201 includes a plurality of sacrificial layers 203 overlapping along a normal direction of the surface of the substrate 200, and channel layers 204 between two adjacent sacrificial layers 203 of the plurality of sacrificial layers 203. A dummy gate structure 205 is formed on the substrate 200 to cross two adjacent fin structures 201 of the plurality of fin structures 201.

As illustrated in FIG. 4, a portion of the dummy gate structure 205 is removed to form an opening (not illustrated). The opening has a second width D2 smaller than the first width D1. The opening is disposed in the isolation groove. An isolation layer 202 is formed in the opening.

Since the second width D2 of the opening is smaller than the first width D1 of the isolation groove, the subsequently formed isolation layer 202 does not cover a sidewall of each of the plurality of sacrificial layers 203 and a sidewall of each of the channel layers 204 at one side. Correspondingly, when subsequently removing the plurality of sacrificial layers 203, a low etching efficiency and an incomplete etch are prevented. Further, when subsequently form the gate structure, a low deposition efficiency and a low density of the gate structure are prevented. The formed gate structure further completely covers the channel layers 104 from four sides. Correspondingly, an area of the channel region formed by the gate structure covering the channel layers 204 is increased. The performance of the formed semiconductor structure is improved.

However, after forming the dummy gate structure, a portion of the dummy gate structure needs to be removed to form the opening, and the second width D2 of the opening needs to be smaller than the first width D1 of the isolation groove. The process has a high requirement on the alignment accuracy of the photomask etching and is difficult.

The present disclosure provides a fabrication method of a semiconductor structure. In the present disclosure, a first isolation layer and a second isolation layer may be formed sequentially in an isolation groove, and then a dummy gate structure may be formed on the substrate. After forming the dummy gate structure, the first isolation layer may be removed to form gaps between the second isolation layer and each of adjacent fins. Correspondingly, when removing the sacrificial layer subsequently, the sacrificial layer may be removed from two sidewalls of the sacrificial layer simultaneously. The efficiency of the etch and removing may be improved, and complete removal of the sacrificial layer may be guaranteed. When forming a gate structure subsequently, the gate structure may be deposited from two sides of a gate groove simultaneously. The deposition efficiency of the gate structure, and dense of the formed gate structure may be improved. Further, the formed gate structure could surround a channel layer from four sides, and correspondingly an area of a channel region formed by the channel layer surrounded by the gate structure may be increased and the performance of the semiconductor structure may be improved effectively.

Also, by forming the second isolation layer in the isolation groove, cutting the dummy gate structure subsequently may be avoided. An etching process using a photomask mask may be avoided and the difficulty of the fabrication process may be reduced.

Figure 23:
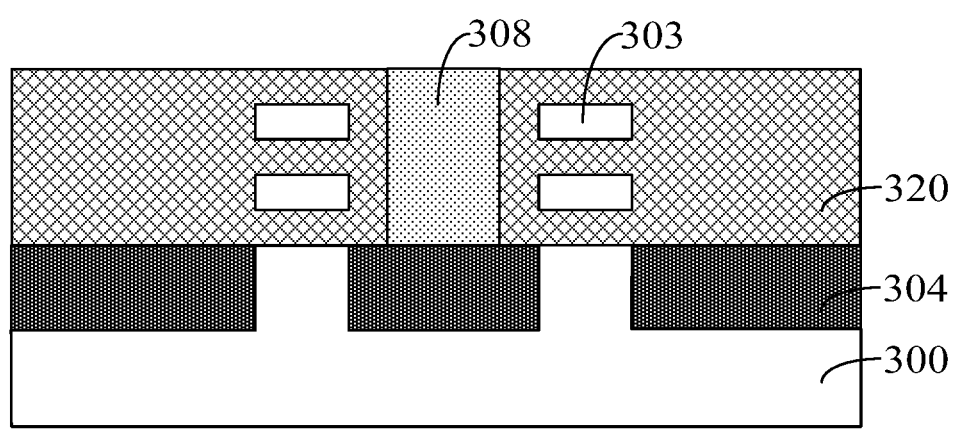
Figure 24:
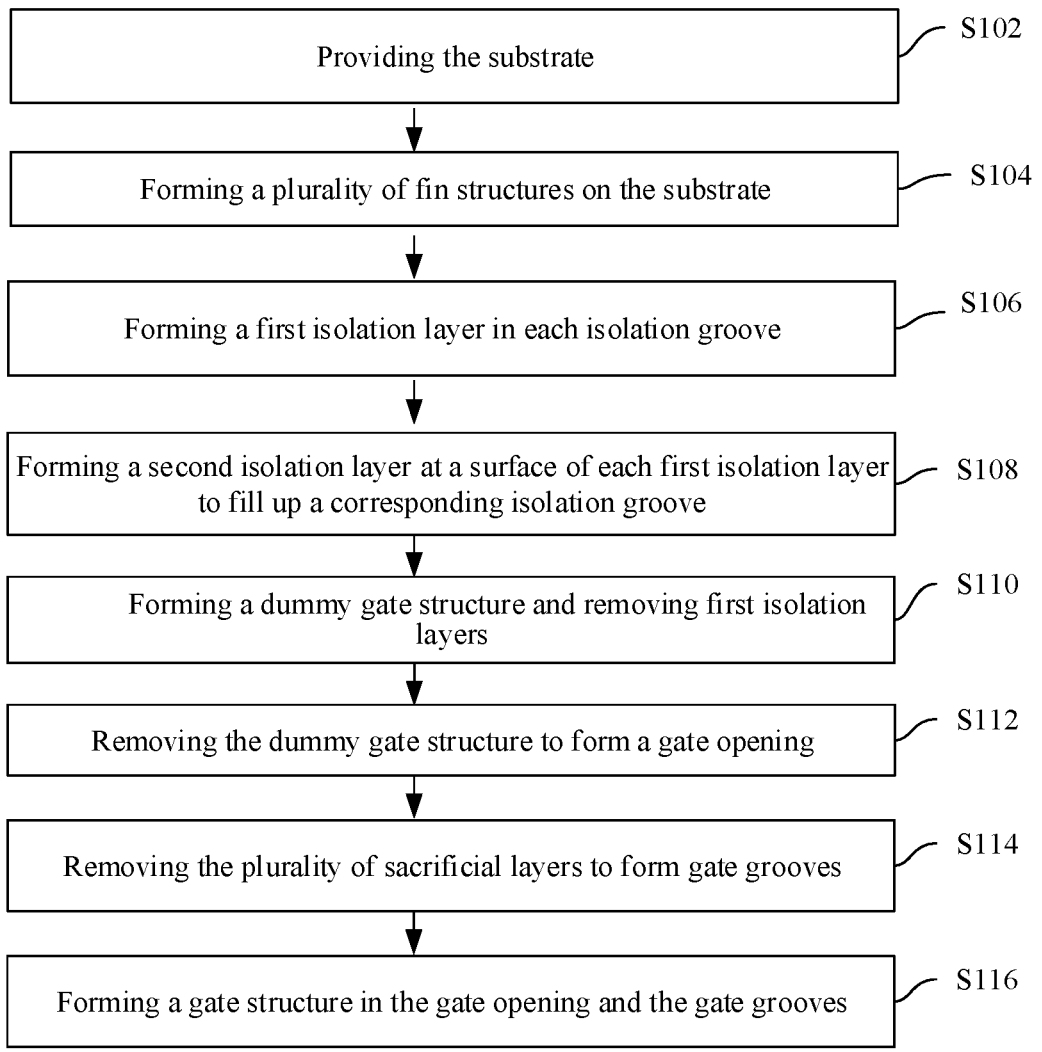
FIG. 24 illustrates an exemplary method for forming a semiconductor device according to various disclosed embodiments of the present disclosure.

FIGS. 5-23 illustrate semiconductor structures corresponding to certain stages for forming an exemplary semiconductor structure according to various disclosed embodiments of the present disclosure; and FIG. 24 illustrates an exemplary method for forming a semiconductor device according to various disclosed embodiments of the present disclosure.

Figure 5:
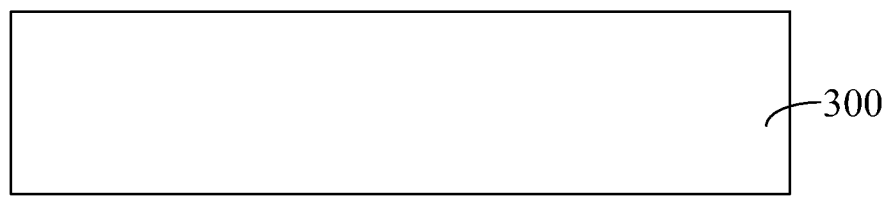
FIGS. 5-23 illustrate semiconductor structures corresponding to certain stages for forming an exemplary semiconductor structure according to various disclosed embodiments of the present disclosure.

As illustrated in FIG. 5, a substrate 300 may be provided (e.g., S102 in FIG. 24).

The substrate 300 may be made of a material including single-crystalline silicon or single-crystalline GeSi. In one embodiment, substrate 300 may be made of single-crystalline silicon.

Figure 6:
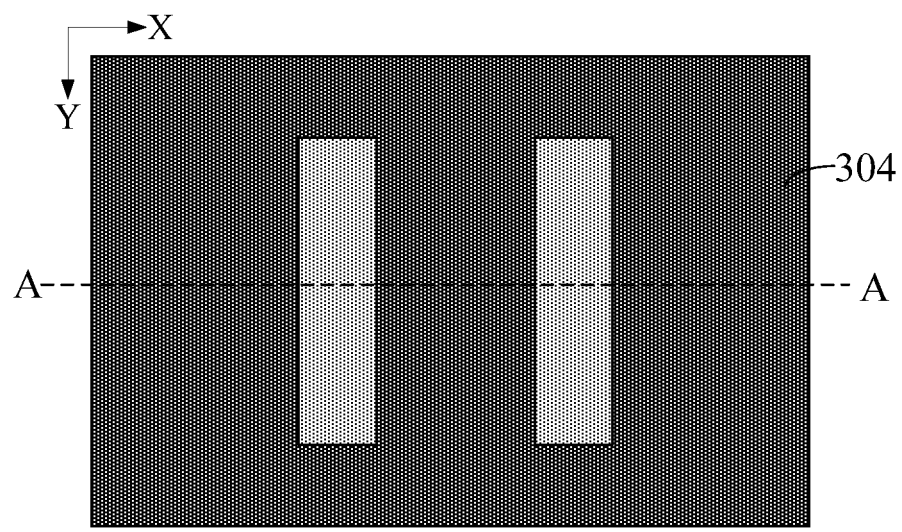
Figure 7:
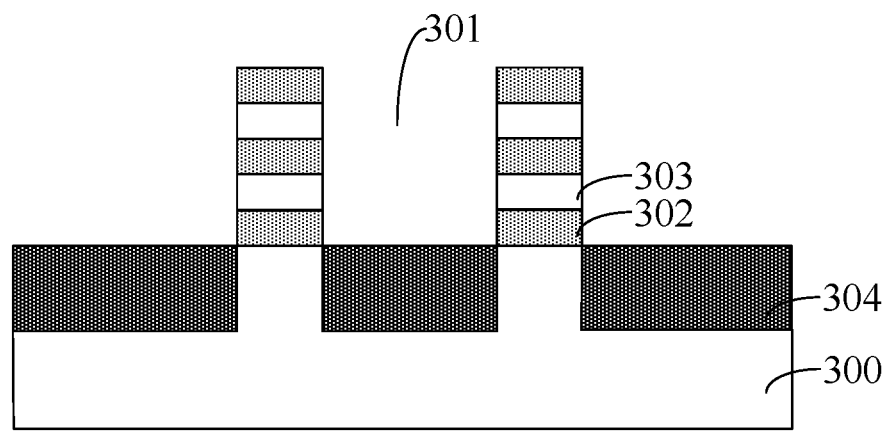

As illustrated in FIG. 6 and FIG. 7 which is a cross-section view along an A-A direction in FIG. 6, a plurality of discrete fin structures may be formed on the substrate 300 (e.g., S104 in FIG. 24). The plurality of fin structures may be arranged parallelly along a first direction Y. An isolation groove 301 may be formed between two adjacent fin structures of the plurality of fin structures. Each of the plurality of fin structures may include a plurality of sacrificial layers 302 stacked along a normal direction of a surface of the substrate 300, and a channel layer 303 between each two adjacent sacrificial layers of the plurality of sacrificial layers 302.

In one embodiment, the plurality of fin structures may include two fin structures. In each of the two fin structures, the plurality of sacrificial layers 302 may include three sacrificial layers 302. Correspondingly, each of the two fin structures may include two channel layers 303.

In one embodiment, the plurality of fin structures may be formed by: forming a fin material film (not shown in the figures) including a plurality of sacrificial material films stacked along the normal direction of the surface of the substrate 300 and a channel material film between each two adjacent sacrificial material films of the plurality of sacrificial material films, on the substrate 300; form a patterned layer (not shown in the figures) on the fin material film; and etching the fin material film by using the patterned layer as a mask until exposing a top surface of the substrate 300, to form the plurality of fin structures. Each of the plurality of fin structures may include the plurality of sacrificial layers 302 stacked along the normal direction of the surface of the substrate 300, and one channel layer 303 between each two adjacent sacrificial layers of the plurality of sacrificial layers 302.

In one embodiment, the plurality of sacrificial layers 302 and the channel layers 303 may be made of different materials. When forming a gate structure subsequently, the plurality of sacrificial layers 302 may be removed. Correspondingly, the plurality of sacrificial layers 302 and the channel layers 303 made of different materials may have a large etching selection ratio, and damage on the channel layers 303 when removing the plurality of sacrificial layers 302 may be reduced.

In one embodiment, the plurality of sacrificial layers 302 may be made of a material including GeSi, and the channel layers 303 may be made of a material including single crystalline silicon.

In one embodiment, after etching the fin material film to form the plurality of fin structures, the method may further include: etching a portion of the substrate 300 by using the plurality of fin structures as a mask, and forming an isolation structure 304 on the substrate 300. A top surface of the isolation structure 304 may be lower than the top surface of the substrate 300.

The isolation structure 304 may be made of a material including $SiO_2$ or $SiN_x$. In one embodiment, the isolation structure 304 may be made of $SiN_x$.

After forming the plurality of fin structures, the method may further include forming a first isolation layer in each isolation groove 301 (e.g., S106 in FIG. 24) and forming a second isolation layer on a surface of each first isolation layer and filling the corresponding isolation groove 301 (e.g., S108 in FIG. 24). Each first isolation layer may be disposed on sidewalls of corresponding adjacent fin structures of the plurality of fin structures. Formation of the first isolation layers and the second isolation layers are illustrated in FIGS. 8-10.

Figure 8:
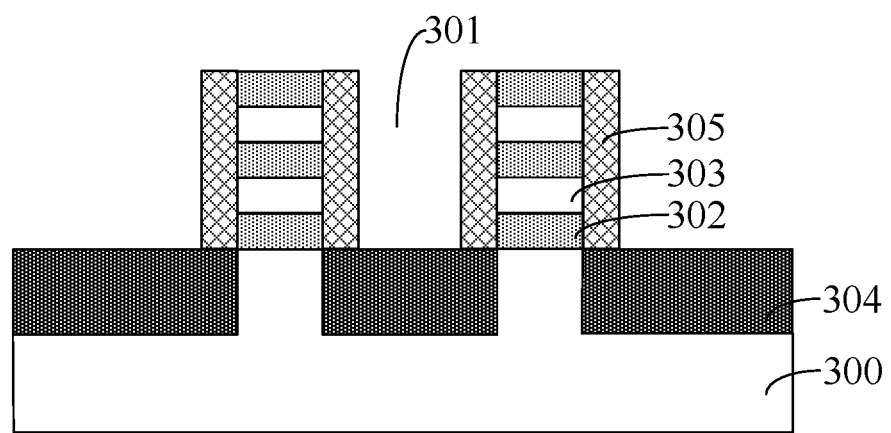

As illustrated in FIG. 8 which has a view angle same as FIG. 7, a first isolation material layer 305 may be formed on the top surface of substrate 300, top surfaces of the plurality of fin structures, and side surfaces of the plurality of fin structures. Subsequently, the first isolation material layer 305 may be etched back until exposing the top surface of substrate 300 and the top surfaces of the plurality of fin structures.

In one embodiment, the first isolation material layer 305 may be formed by a method including an atomic layer deposition method.

Figure 9:
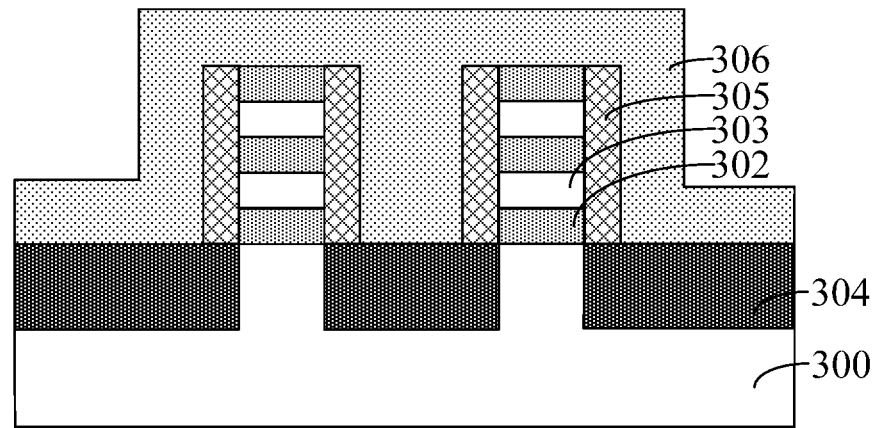
Figure 10:
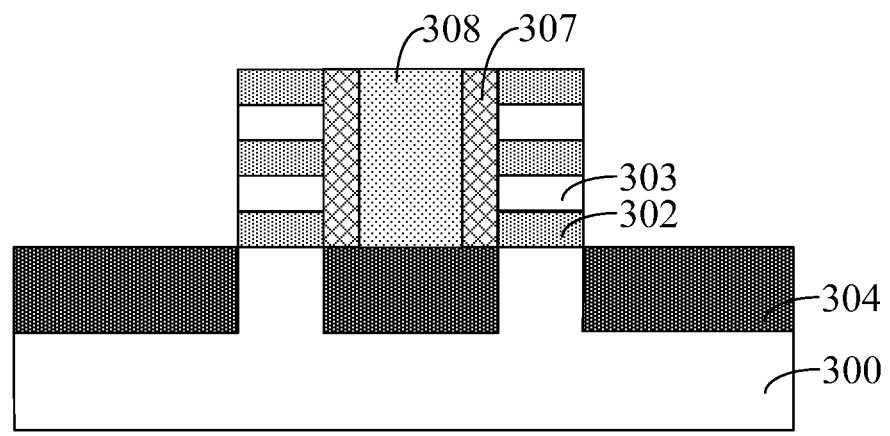

As illustrated in FIG. 9, a second isolation material layer 306 may be formed on the top surface of substrate 300, the top surfaces of the plurality of fin structures, a top surface of the first isolation material layer 305, and side surfaces of the first isolation material layer 305. The second isolation material layer 306 may fill the isolation grooves 301.

In one embodiment, the second isolation material layer 306 may be formed by a method including an atomic layer deposition method.

As illustrated in FIG. 10, the second isolation material layer 306 may be planarized until exposing the top surface of substrate 300, the top surfaces of the plurality of fin structures, and the top surface of the first isolation material layer 305, to form the first isolation layers 307 and the second isolation layers 308. After forming the first isolation layers 307 and the second isolation layers 308, a portion of the first isolation material layer 305 and a portion of the second isolation material layer 306 outside the isolation grooves 301 may be removed.

In one embodiment, the first isolation layers 307 and the second isolation layers 308 may be made of different materials. The first isolation layers 307 may be removed subsequently. The first isolation layers 307 and the second isolation layers 308 made of different materials may have a large etching selection ratio. Correspondingly, damage on the second isolation layers 308 when removing the first isolation layers 307 may be reduced.

The first isolation layers 307 may be made of a material including $SiO_2$, SiNO, amorphous silicon, or SiGe. The second isolation layers 308 may be made of a material including $SiN_x$ or SiC. A thickness direction of the second isolation layers 308 may be a direction perpendicular to the sidewalls of the plurality of fin structures. In one embodiment, the first isolation layers 307 may be made of $SiO_2$, and the second isolation layers 308 may be made of a material including $SiN_x$.

Figure 11:
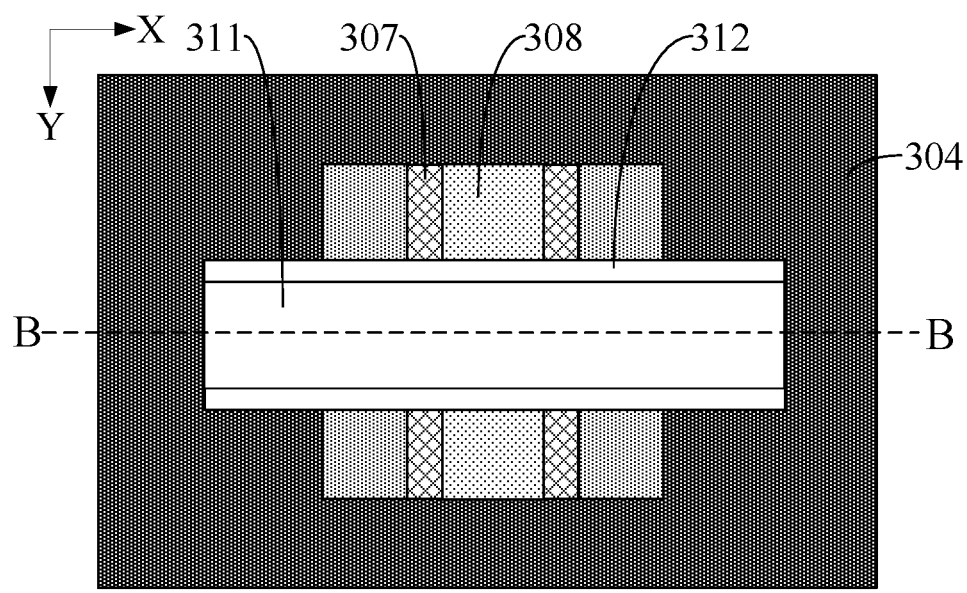
Figure 12:
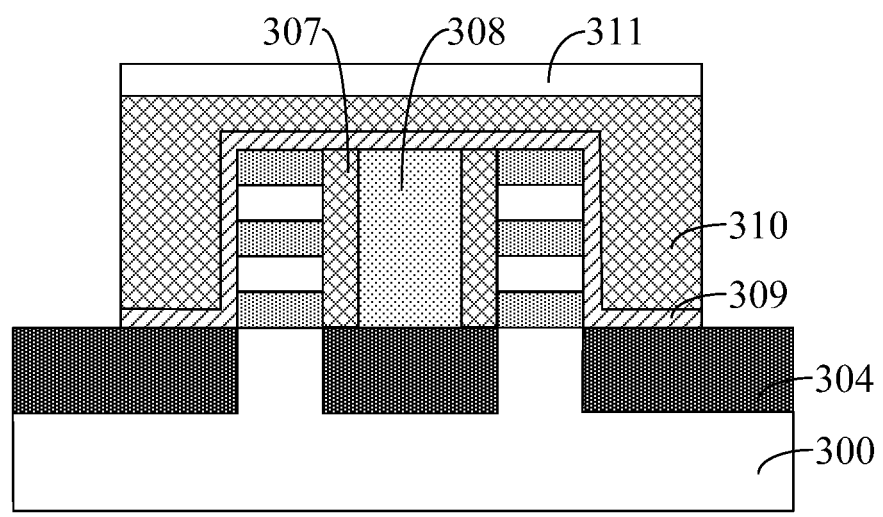

As illustrated in FIG. 11 and FIG. 12 which is a cross-section view along a B-B direction in FIG. 11, after forming the second isolation layers 308, a dummy gate structure may be formed on the substrate 300 to cross the plurality of fin structures (e.g., S110 in FIG. 24). The dummy gate structure may extend along a second direction X. The second direction X may be perpendicular to the first direction Y.

In one embodiment, the dummy gate structure may include: a gate dielectric layer 309 on the plurality of fins structures, a dummy gate electrode layer 310 on the gate dielectric layer 309, a protective layer 311 on the dummy gate electrode layer 310, and a spacer 312 on sidewalls of the dummy gate electrode layer 310 and the protective layer 311.

In one embodiment, the dummy gate electrode layer 310 may be made of polycrystalline silicon. In some other embodiments, the dummy gate electrode layer 310 may be made of a material including amorphous silicon.

In one embodiment, the protective layer 311 may be made of $SiN_x$. In other embodiments, the protective layer 311 may be made of a material including $SiO_2$.

The spacer 312 may be formed by: forming a spacer material layer (not shown in the figures) on a top surface of the gate dielectric layer 309, the sidewalls of the dummy gate electrode layer 310, the sidewalls and a top surface of the protective layer 311; and etching back the spacer material layer until exposing the top surfaces of the protective layer 311 and the gate dielectric layer 309, to form the spacer 312.

The spacer material layer may be formed by a method including a chemical vapor deposition method, a physical vapor deposition method, an atomic layer deposition method, or a combination thereof. In one embodiment, the spacer material layer may be formed by the atomic layer deposition method.

The spacer 312 may be made of a material including $SiO_2$, $SiN_x$, SiNO, SiCO, SiCN, or SiCNO. In one embodiment, the spacer 312 may be made of $SiN_x$.

In one embodiment, the spacer 312 may be used to define positions of source/drain doped layers formed subsequently.

After forming the dummy gate structure, the plurality of fin structures may be etched by using the dummy gate structure as a mask, to form source/drain grooves in the plurality of fin structures. Subsequently, the plurality of sacrificial layers 302 exposed by the source/drain grooves may be etched, to form fin grooves between adjacent channel layers 303. The process for forming the source/drain grooves and the fin grooves is illustrated in FIGS. 13-15.

Figure 13:
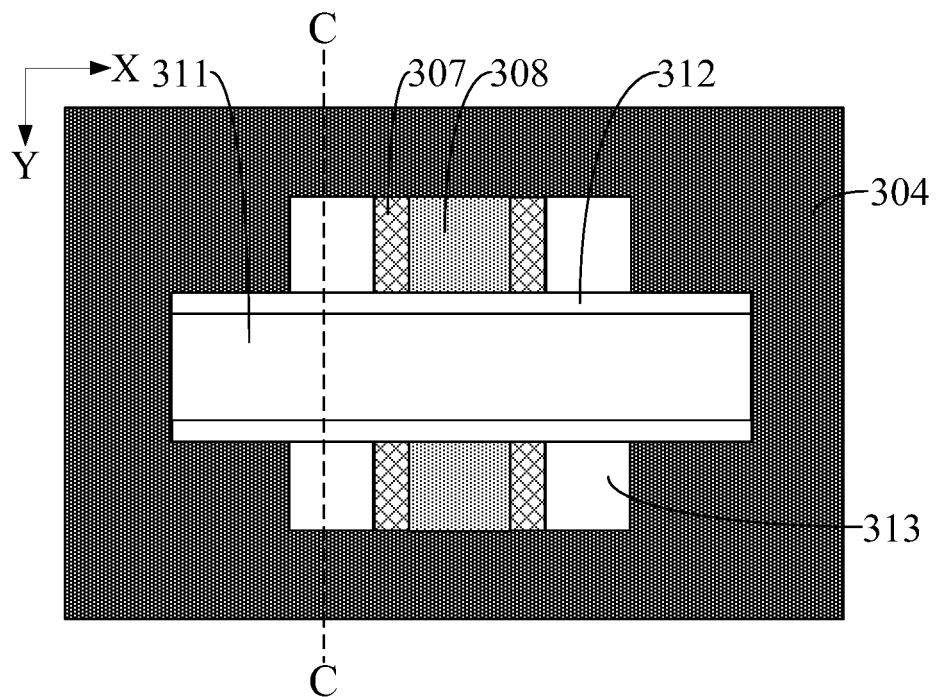
Figure 14:
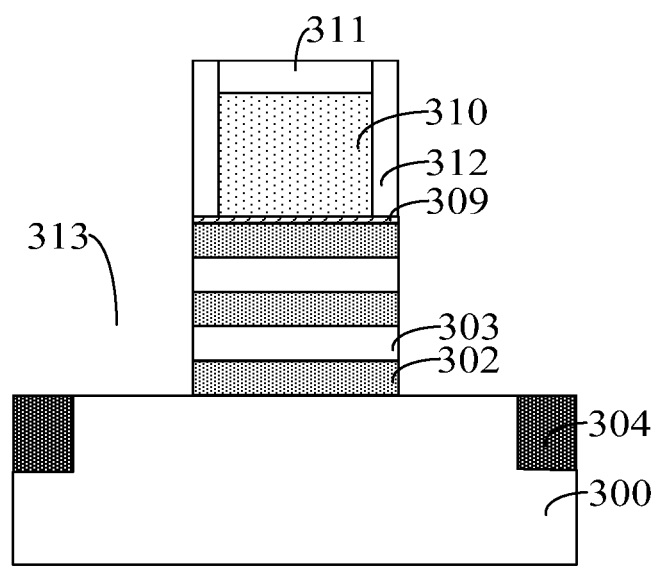
Figure 15:
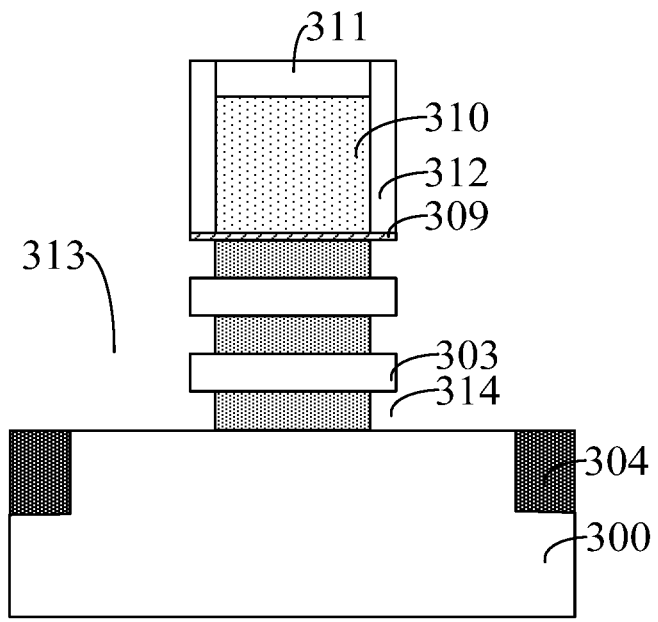

As illustrated in FIG. 13 and FIG. 14 which is a cross-section view along a C-C direction in FIG. 13, the plurality of fin structures may be etched by using the dummy gate structure as a mask, to form source/drain grooves 313 in the plurality of fin structures.

In one embodiment, the source/drain grooves 313 may provide spaces for subsequently formed source/drain doped layers.

The plurality of fin structures may be etched by a method including an anisotropic dry etching method or an anisotropic wet etching method. In one embodiment, the plurality of fin structures may be etched by an anisotropic dry etching method. The dry etching method may use: an etching gas including HBr and Ar, a flow rate of HBr being about 10 sccm to about 1000 sccm, and a flow rate of Ar being about 10 sccm to about 1000 sccm.

As illustrated in FIG. 15 which has a view angle same as FIG. 14, the plurality of sacrificial layers 302 exposed by the source/drain grooves 313 may be etched, to form fin grooves 314 between adjacent channel layers 303.

In one embodiment, the fin grooves 314 may provide spaces for subsequently formed barrier layers.

In one embodiment, a portion of the plurality of sacrificial layers 302 exposed by sidewalls of the source/drain grooves 313 may be removed by a method including a wet etching method. The wet etching method may use: an etching solution including HCl gas, a temperature of about 25° C. to about 300° C., and a volume ratio of the etching solution including HCl gas being about 20% to about 90%.

Figure 16:
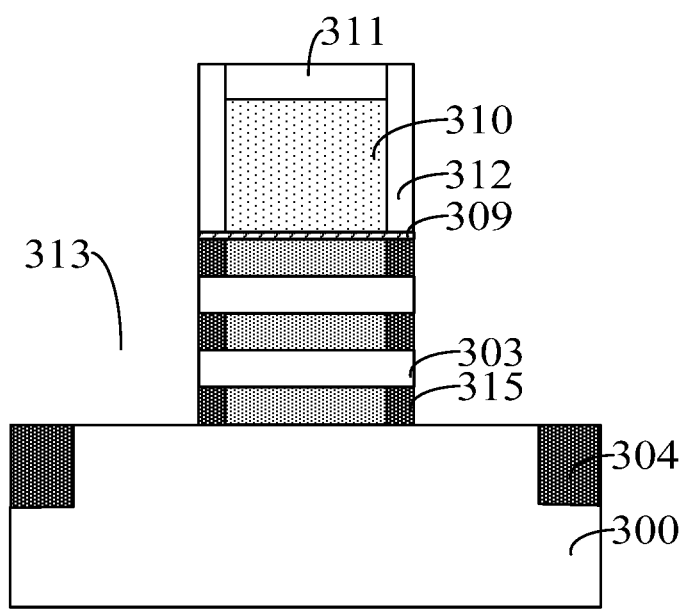

As illustrated in FIG. 16, after forming the fin grooves 314, barrier layers 315 may be formed in the fin grooves 314.

In one embodiment, the barrier layers 315 may be formed by: forming a first initial barrier layer (not shown in the figures) on sidewalls and bottom surfaces of the source/drain grooves 313, and the sidewalls and top surface of the dummy gate electrode layer; etching back the first initial barrier layer until exposing the bottom surfaces of the source/drain grooves 313 and the top surface of the dummy gate electrode layer, to form a second initial barrier layer; and etching back the second initial barrier layer until exposing the sidewalls of the channel layers 303, to form the barrier layers 315.

In one embodiment, the barrier layers 315 may be made of a material including $SiN_x$.

The first initial barrier layer may be formed by a method including a physical vapor deposition method, a chemical vapor deposition method, or an atomic layer deposition method. In one embodiment, the first initial barrier layer may be formed by the atomic layer deposition method.

The first initial barrier layer and the second initial barrier layer may be etched back by using a method including a wet etching method or a dry etching method. In one embodiment, the first initial barrier layer and the second initial barrier layer may be etched back by using the dry etching method. The dry etching method may use: an etching gas including $CF_4$ and $CH_2F_2$, a flow rate of $CF_4$ being about 50 sccm to about 500 sccm, and a flow rate of $CH_2F_2$ being about 30 sccm to about 100 sccm.

Figure 17:
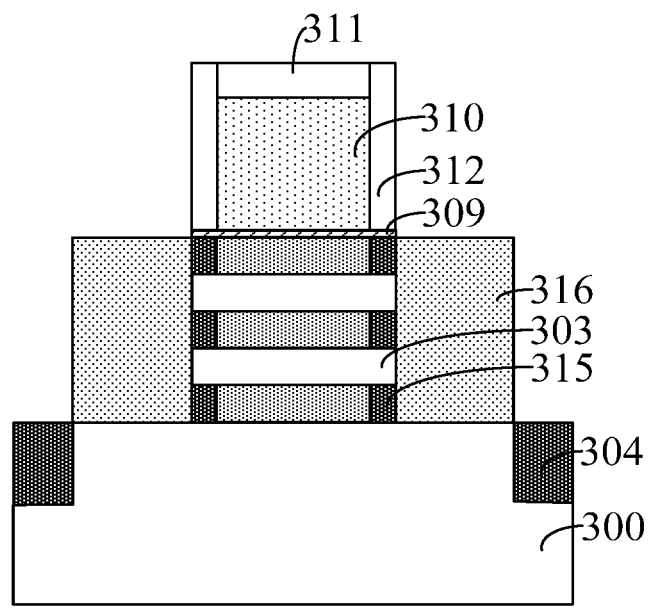

As illustrated in FIG. 17, after forming the barrier layers 315, source/drain doped layers 316 may be formed in the source/drain grooves 313. The source/drain doped layers 316 may include source/drain ions.

In one embodiment, the source/drain doped layers 316 may be formed by an epitaxial growth process, and the source/drain ions may be doped into the source/drain doped layers 316 by an in-situ doping process.

In one embodiment, the semiconductor structure may be a P-type device, and the source/drain doped layers 316 may be made of a material including silicon, germanium, or GeSi. Correspondingly, the source/drain ions may be P-type ions, and may include boron ions, $BF^{2-}$ ions, or indium ions. In some other embodiments, the semiconductor structure may be an N-type device, and the source/drain doped layers 316 may be made of a material including silicon, GaAs, or AsGaIn. Correspondingly, the source/drain ions may be N-type ions, and may include phosphorus ions, or arsenic ions.

In one embodiment, the semiconductor structure may be an N-type device, and the source/drain doped layers 316 may be made of silicon, and the source/drain ions may include phosphorus ions.

Figure 18:
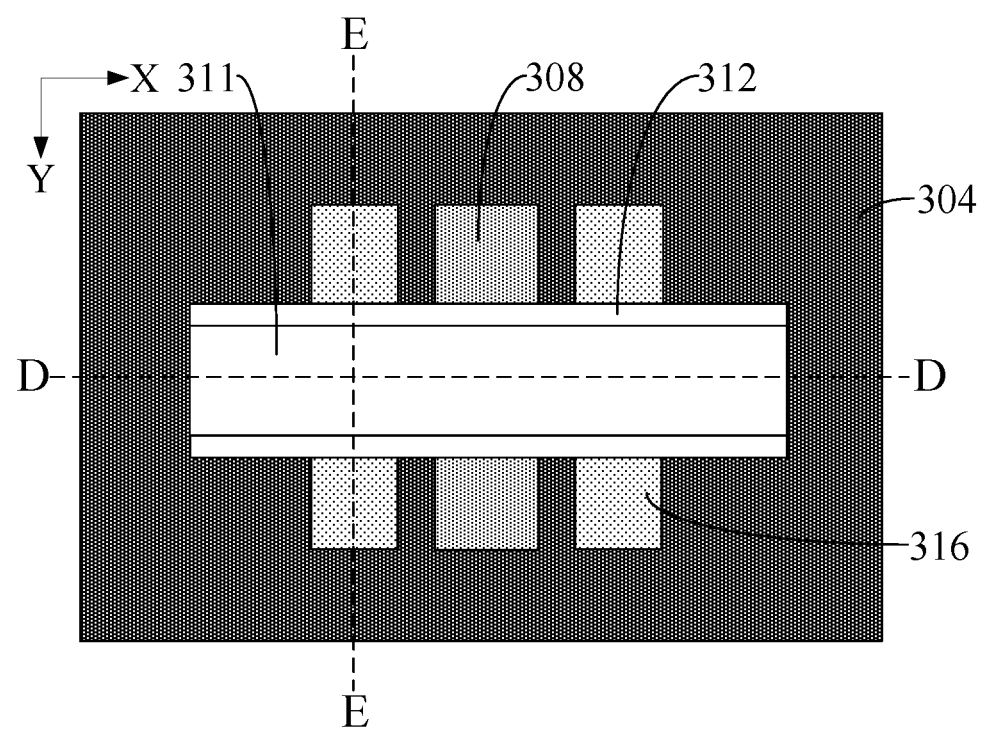
Figure 19:
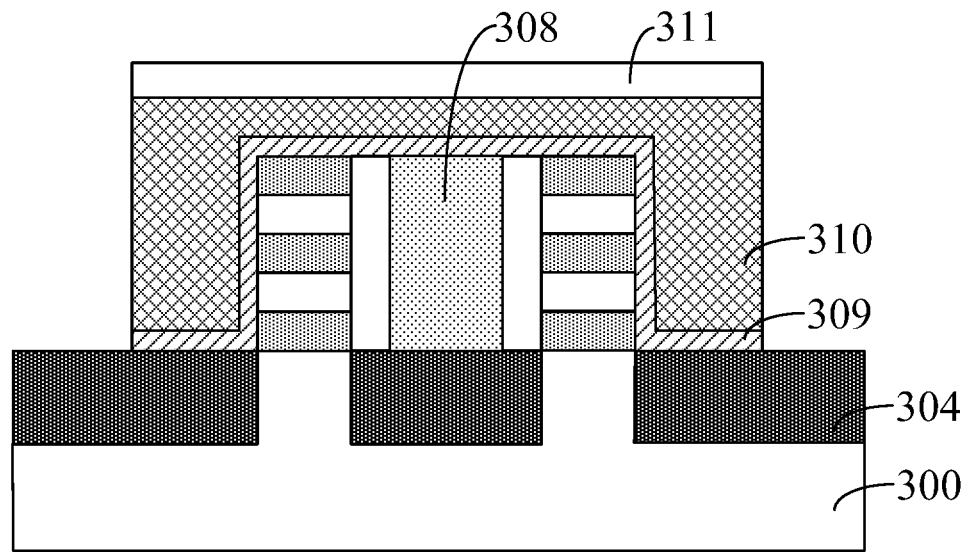
Figure 20:
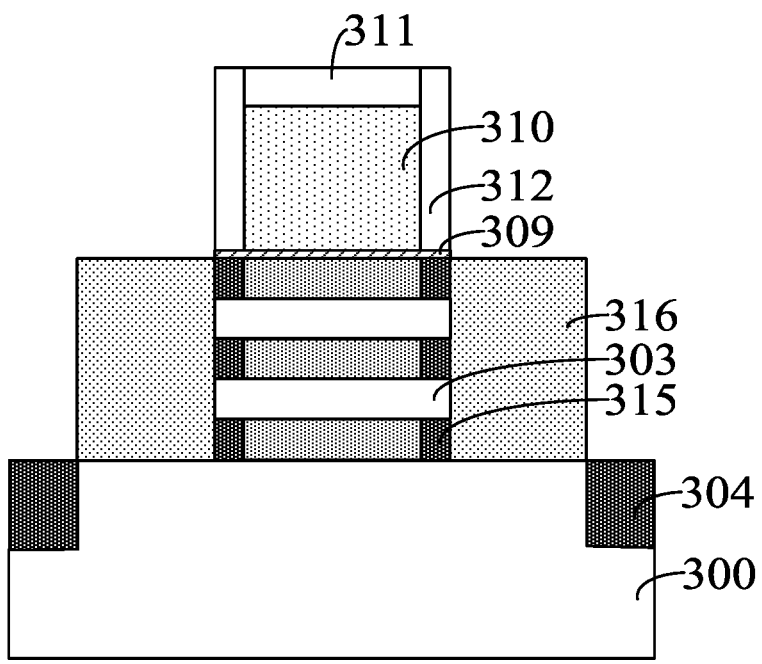

As illustrated in FIG. 18, FIG. 19 which is a cross-section view along a D-D direction in FIG. 18, and FIG. 20 which is a cross-section view along an E-E direction in FIG. 18, after forming the source/drain doped layers 316, the first isolation layers 307 may be removed (e.g., S110 in FIG. 24).

By removing the first isolation layers 307, gaps may be formed between the second isolation layers 308 and the sidewalls of the adjacent fin structures. Correspondingly, when removing the plurality of sacrificial layers 302, the plurality of sacrificial layers 302 may be removed from two sides of each of the plurality of sacrificial layers 302 simultaneously. The efficiency of the etch and removing may be improved, and complete removal of the sacrificial layer may be guaranteed. When forming a gate structure subsequently, the gate structure may be deposited from two sides of a gate groove simultaneously. The deposition efficiency of the gate structure, and dense of the formed gate structure may be improved. Further, the formed gate structure could surround a channel layer from four sides, and correspondingly an area of a channel region formed by the channel layer surrounded by the gate structure may be increased and the performance of the semiconductor structure may be improved effectively.

Also, by forming the second isolation layers 308 in the isolation grooves 301, cutting the dummy gate structure subsequently may be avoided. An etching process using a photomask mask may be avoided and the difficulty of the fabrication process may be reduced.

A thickness of the first isolation layers 307 may be about 2 nm to about 6 nm. Correspondingly, the gaps between the second isolation layers 308 and the sidewalls of the adjacent fin structures may be large. The etching solution may contact the plurality of sacrificial layers efficiently, to improve the etching efficiency.

A thickness of the second isolation layers 308 may be about 2 nm to about 6 nm. Correspondingly, a thickness of the finally reserved second isolation layers 308 may be large. The isolation effect of the second isolation layers 308 to the adjacent fin structures may be improved, to reduce appearance of leakage currents.

Figure 21:
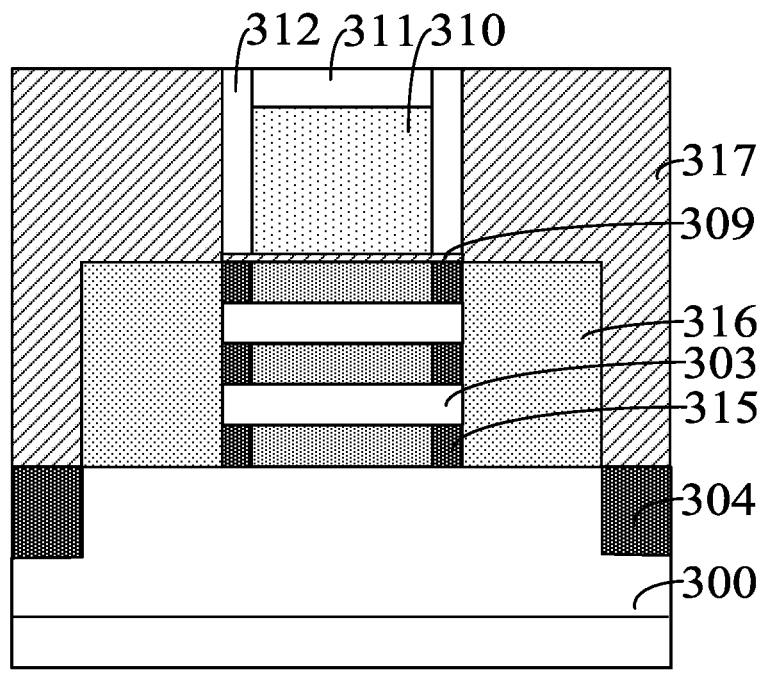

As illustrated in FIG. 21 which has a view angle same as FIG. 20, after removing the first isolation layers 307, a dielectric layer 317 may be formed on the substrate 300. The dielectric layer 317 may be disposed on the sidewalls of the dummy gate structure and expose the top surface of the dummy gate structure.

In one embodiment, the dielectric layer 317 may further cover the source/drain doped layers 316.

In one embodiment, the dielectric layer 317 may be formed by: forming an initial dielectric layer (not shown in the figures) on the source/drain doped layers 316 and on the dummy gate structure, to cover the sidewalls and the top surface of the dummy gate structure; and planarizing the initial dielectric layer until exposing the surface of the protective layer 311 at the top of the dummy gate structure, to form the dielectric layer 317.

In one embodiment, the dielectric layer 317 may be made of a material including $SiO_2$.

Figure 22:
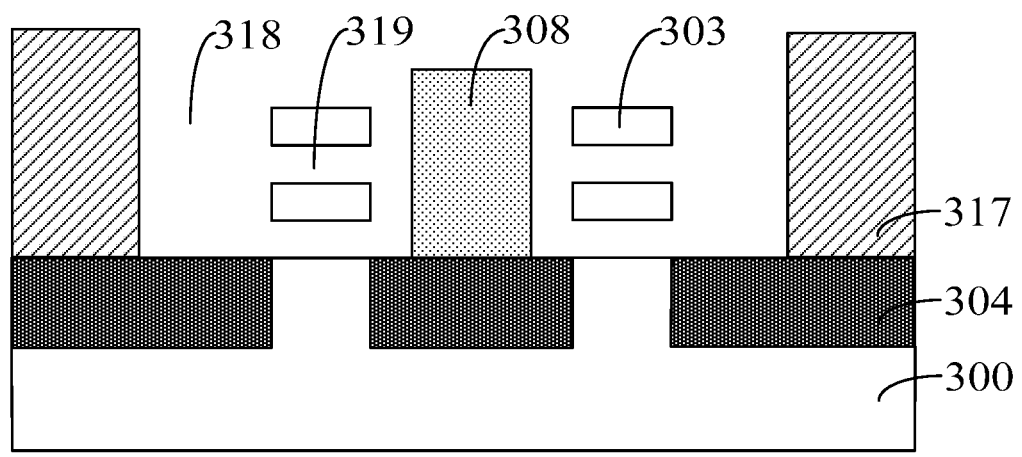

As illustrated in FIG. 22 which has a view angle same as FIG. 19, the dummy gate structure may be removed, to form a gate opening 318 at ends of the plurality of sacrificial layers 302 along the second direction X perpendicular to the first direction Y (e.g., S112 in FIG. 24). And then the plurality of sacrificial layers 302 may be removed to form a gate groove 319 between each two adjacent channel layers 303 (e.g., S114 in FIG. 24).

In one embodiment, the protective layer 311, the dummy gate electrode layer 310, and the gate dielectric layer 309 of the dummy gate structure may be removed.

In one embodiment, the gate opening 318 may be disposed in the dielectric layer 317.

As illustrated in FIG. 23, a gate structure may be formed in the gate opening 318 and the gate grooves 319 (e.g., S116 in FIG. 24). The gate structure may surround the channel layers 303.

In one embodiment, the gate structure may be formed by: forming an initial gate structure (not shown in the figures) in the gate opening 318 and the gate grooves 319, to cover the second isolation layers 308; and planarizing the initial gate structure until exposing the top surfaces of the second isolation layers 308, to form the gate structure.

In one embodiment, the initial gate structure may be planarized by a method including a chemical mechanical polishing method (CMP).

In one embodiment, the gate structure may include a gate electrode layer 320.

The gate electrode layer 320 may be made of a metal including copper, tungsten, nickel, chromium, titanium, tantalum, aluminum, or a combination thereof. In one embodiment, the gate electrode layer may be made of tungsten.

In the present disclosure, a first isolation layer and a second isolation layer may be formed sequentially in an isolation groove, and then a dummy gate structure may be formed on the substrate. After forming the dummy gate structure, the first isolation layer may be removed to form gaps between the second isolation layer and each of adjacent fins. Correspondingly, when removing the sacrificial layer subsequently, the sacrificial layer may be removed from two sidewalls of the sacrificial layer simultaneously. The efficiency of the etch and removing may be improved, and complete removal of the sacrificial layer may be guaranteed. When forming a gate structure subsequently, the gate structure may be deposited from two sides of a gate groove simultaneously. The deposition efficiency of the gate structure, and dense of the formed gate structure may be improved. Further, the formed gate structure could surround a channel layer from four sides, and correspondingly an area of a channel region formed by the channel layer surrounded by the gate structure may be increased and the performance of the semiconductor structure may be improved effectively. Also, by forming the second isolation layer in the isolation groove, cutting the dummy gate structure subsequently may be avoided. An etching process using a photomask mask may be avoided and the difficulty of the fabrication process may be reduced.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a semiconductor structure, comprising:
 providing a substrate;
 forming a plurality of fin structures on the substrate, wherein:
  the plurality of fin structures is arranged parallelly along a first direction, and isolation grooves are formed between adjacent fin structures of the plurality of fin structures; and
  each of the plurality of fin structures includes a plurality of sacrificial layers stacked along a normal direction of a surface of the substrate, and a channel layer between every two adjacent sacrificial layers of the plurality of sacrificial layers;
 forming a first isolation layer in each isolation groove;
 forming a second isolation layer on each first isolation layer to fill up a corresponding isolation groove;
 forming a dummy gate structure and removing first isolation layers after forming the dummy gate structure;
 removing the dummy gate structure to form a gate opening at ends of the plurality of sacrificial layers along a second direction perpendicular to the first direction;
 removing the plurality of sacrificial layers to form gate grooves between adjacent channel layers; and
 forming a gate structure in the gate opening and the gate grooves, wherein the gate structure surrounds the channel layers.

2. The method according to claim 1, wherein:
the first isolation layers are disposed at adjacent sidewalls of the plurality of fin structures.

3. The method according to claim 1, wherein:
the dummy gate structure is formed after forming the second isolation layers, and the dummy gate structure crosses adjacent fin structures of the plurality of fin structures along the second direction.

4. The method according to claim 1, further including:
forming a dielectric layer on the substrate, wherein the dielectric layer is disposed on sidewalls of the dummy gate structure and exposes a top surface of the dummy gate structure.

5. The method according to claim 1, wherein the first isolation layers and the second isolation layers are formed by:
 forming a first isolation material layer on the surface of the substrate, top surfaces of the plurality of fin structures, and sidewalls of the plurality of fin structures;
 etching back the first isolation material layer, to expose the surface of the substrate and the top surfaces of the plurality of fin structures;
 forming a second isolation material layer on the substrate, the top surfaces of the plurality of fin structures, top surfaces of the first isolation layers, and sidewalls of the first isolation layers, wherein the second isolation material layer fills up the isolation grooves;
 planarizing the second isolation material layer until exposing the top surface of the substrate, the top surfaces of the plurality of fin structures, and the top surfaces of the first isolation layers, to form the first isolation layers and the second isolation layers; and
 after forming the first isolation layers and the second isolation layers, removing a portion of the first isolation material layer and the second isolation layer outside the isolation grooves.

6. The method according to claim 5, wherein the first isolation material layer is formed by a process including an atomic layer deposition process and the second isolation material layer is formed by a process including an atomic layer deposition process.

7. The method according to claim 1, wherein the first isolation layers are made of a material different from a material of the second isolation layers.

8. The method according to claim 7, wherein:
the first isolation layers are made of $SiO_2$, SiNO, amorphous carbon, SiGe, or a combination thereof; and
the second isolation layers are made of $SiN_x$, SiC, or a combination thereof.

9. The method according to claim 1, wherein:
the first isolation layers are removed by a wet etch process or a dry etch process.

10. The method according to claim 1, wherein:
a thickness of each first isolation layer is about 2 nm to about 6 nm; and
a thickness of each second isolation layer is about 2 nm to about 6 nm.

11. The method according to claim 1, wherein the plurality of fin structures is formed by:
forming a fin material film including a plurality of sacrificial material films stacked along the normal direction of the surface of the substrate and a channel material film between each two adjacent sacrificial material films of the plurality of sacrificial material films, on the substrate;
form a patterned layer on the fin material film; and
etching the fin material film by using the patterned layer as a mask until exposing the surface of the substrate, to form the plurality of fin structures, wherein each of the plurality of fin structures includes the plurality of sacrificial layers stacked along the normal direction of the surface of the substrate and one channel layer between each two adjacent sacrificial layers of the plurality of sacrificial layers.

12. The method according to claim 11, after forming the dummy gate structure, further including:
etching the plurality of fin structures by using the dummy gate structure as a mask, to form source/drain grooves in the plurality of fin structures; and
etching the source/drain grooves to expose the plurality of sacrificial layers and form fin grooves between adjacent channel layers.

13. The method according to claim 12, after forming the fin grooves, further including:
forming a barrier layer in each fin groove; and
the barrier layer is made of a material including $SiN_x$.

14. The method according to claim 13, wherein the barrier layer is formed by:
forming a first initial barrier layer on sidewalls and bottom surfaces of the source/drain grooves, and sidewalls and top surface of the dummy gate structure;
etching back the first initial barrier layer until exposing the bottom surfaces of the source/drain grooves and the top surface of the dummy gate structure, to form a second initial barrier layer; and
etching back the second initial barrier layer until exposing sidewalls of the channel layers, to form one barrier layer in each fin groove.

15. The method according to claim 14, wherein:
the first initial barrier layer is formed by a physical vapor deposition process or a chemical vapor deposition process; and
the first initial barrier layer and the second initial barrier layer are etched back by a wet etch process, a dry etch process, or a combination thereof.

16. The method according to claim 13, after forming the barrier layer, further including:
forming source/drain doped layers in the source/drain grooves, wherein the source/drain doped layers include source/drain ions, wherein:
the source/drain doped layers are formed by an epitaxial growth process, and the source/drain ions are doped into the source/drain doped layers by an in-situ doping process.

17. The method according to claim 1, wherein:
the plurality of sacrificial layers and the channel layers are made of different materials.

18. The method according to claim 17, wherein:
the plurality of sacrificial layers is made of single-crystalline GeSi; and
the channel layers are made of single-crystalline silicon.

19. The method according to claim 1, wherein:
the dummy gate structure includes a dummy gate electrode layer;
the dummy gate electrode layer is made of polycrystalline silicon, amorphous silicon, or a combination thereof;
the gate structure includes a gate electrode layer; and
the gate electrode layer is made of a metal including tungsten.

20. The method according to claim 1, wherein the gate structure is formed by:
forming an initial gate structure in the gate opening and the gate grooves, to cover the second isolation layers; and planarizing the initial gate structure until exposing top surfaces of the second isolation layers, to form the gate structure.

* * * * *